United States Patent
Yau (10) Patent No.: US 7,764,734 B2
(45) Date of Patent: Jul. 27, 2010

(54) DIGITAL PULSE WIDTH MODULATION WITH VARIABLE PERIOD AND ERROR DISTRIBUTION

(75) Inventor: Samuel Chi Hong Yau, San Jose, CA (US)

(73) Assignee: Winbond Electronics Corporation, Hsinchu (TW)

( * ) Notice: Subject to any disclaimer, the term of this patent is extended or adjusted under 35 U.S.C. 154(b) by 895 days.

(21) Appl. No.: 11/591,114

(22) Filed: Oct. 31, 2006

(65) Prior Publication Data

US 2008/0101453 A1    May 1, 2008

(51) Int. Cl.
*H03K 7/08* (2006.01)

(52) U.S. Cl. ............... 375/238; 332/106; 332/107; 332/108; 332/109; 341/53; 327/172; 327/175; 327/176

(58) Field of Classification Search ............ 375/238, 375/259; 332/106–109; 341/53; 327/172, 327/175–176
See application file for complete search history.

(56) References Cited

U.S. PATENT DOCUMENTS 6,487,246 B1 * 11/2002 Hoeld ................. 375/238
6,489,901 B1 * 12/2002 Venkitachalam et al. ...... 341/61
7,206,343 B2 * 4/2007 Pearce ................. 375/238
7,307,461 B2 * 12/2007 Nguyen et al. ............ 327/172

OTHER PUBLICATIONS

Weibo Li et al., "Conversion of a Single-Bit Signal into a PWM Signal", 2004 IEEE Region 10 Conference, pp. 519-522.

* cited by examiner

*Primary Examiner*—Mohammad H Ghayour
*Assistant Examiner*—Sophia Vlahos
(74) *Attorney, Agent, or Firm*—Blakely Sokoloff Taylor & Zafman LLP (57) ABSTRACT

Digital pulse width modulation with variable period and error distribution that improves the tradeoff between resolution and clock speed in pulse width modulation circuits so that a higher resolution can be achieved with a lower clock speed. A preferred method includes, for a signal sample S and each value of P in a range Pmin to Pmax of pulse periods P, determining a pulse width V=round(P*S), where round(P*S) is the closest integer value of P*S, and the magnitude of the error |E|=|S−V/P|, for the value of V (Vopt) and P (Popt) associated with the lowest value of the magnitude of the error |E|, providing an output pulse of a pulse width Vopt during the pulse period Popt, and successively repeating a) and b). Other aspects of the invention may include error distribution, error squelching to prevent idle-tone, idle-noise artifacts, 2-samples-per-pulse and non-uniform sampling and pulsing. Other features are disclosed.

17 Claims, 10 Drawing Sheets

DIGITAL PULSE WIDTH MODULATION WITH VARIABLE PERIOD AND ERROR DISTRIBUTION

BACKGROUND OF THE INVENTION

1. Field of the Invention

This invention relates to electronic circuits that drive power (often amplified) to output loads. It relates to a class of circuit implementations often called pulse width modulation (PWM). In particular, the input power corresponds to audio signals and the output loads are audio loads such as speakers and headphones. PWM can also be applied to other circuits like DC-DC converters where input power are DC voltages and output loads are some other circuits that require a power supply.

2. Prior Art

Most digital implementations of pulse width modulation mimics the way traditional PWM is done in analog circuits, i.e., by generating a staircase triangular waveform and comparing the generated waveform with the input waveform. The output waveform is often a binary signal (driving the load single-endedly or differentially) or a ternary signal (driving the load differentially). Output resolution is limited by the step-size of the triangular waveform which in turn is limited by the clock speed used for its generation. To obtain high resolution, an extremely fast clock (in the GHz range) is required, which may not be practical for most applications.

Figure 1:
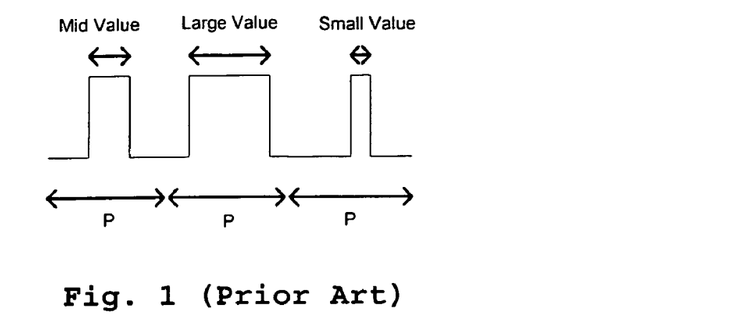
FIG. 1 is an illustration of a variation in duty cycle in a pulse width modulation system.

In pulse width modulation, signal values are encoded in the duty cycles of a rectangular waveform of a fixed period P. Duty cycle, represented in percentage, is defined as the active duration of a pulse (during which a constant power is delivered) divided by P. For example, a duty cycle of 30% means that power is delivered 30% of the time. Defining full scale signal (i.e. 100% duty cycle) to be 1, the "pulse value" K=duty cycle×full scale value (FIG. 1). Varying the duty cycle over time will result in time-varying power supplied to an audio load that generates audible signals.

Figure 2:
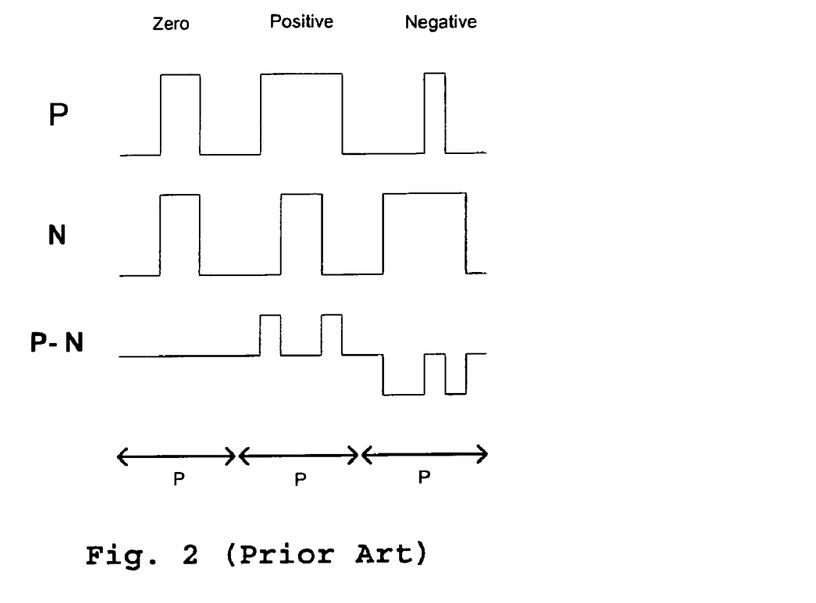
FIG. 2 is an illustration of a differential scheme to achieve negative pulse values.

To achieve negative pulse values, differential schemes are used. Two different signals, P and N, are connected across the 2 terminals of an output load. Power delivered to the load is proportional to P−N, which can be positive, negative or zero (essentially a ternary signal, FIG. 2). Differential schemes generally have better performance than single-ended schemes.

Figure 3:
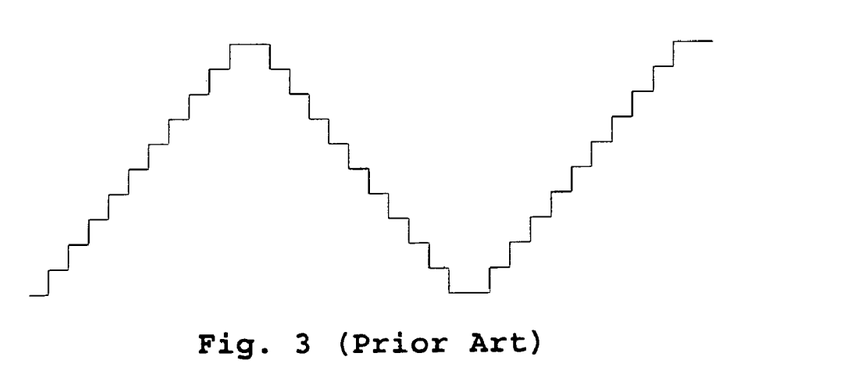
FIG. 3 illustrates a digital (staircase) triangular wave generated in most prior art digital implementations of pulse width modulation.

In most digital implementations, a digital (staircase) triangular wave T is generated (FIG. 3). The frequency of T is called the carrier frequency and is often referred to as $f_{carrier}$.

Figure 4:
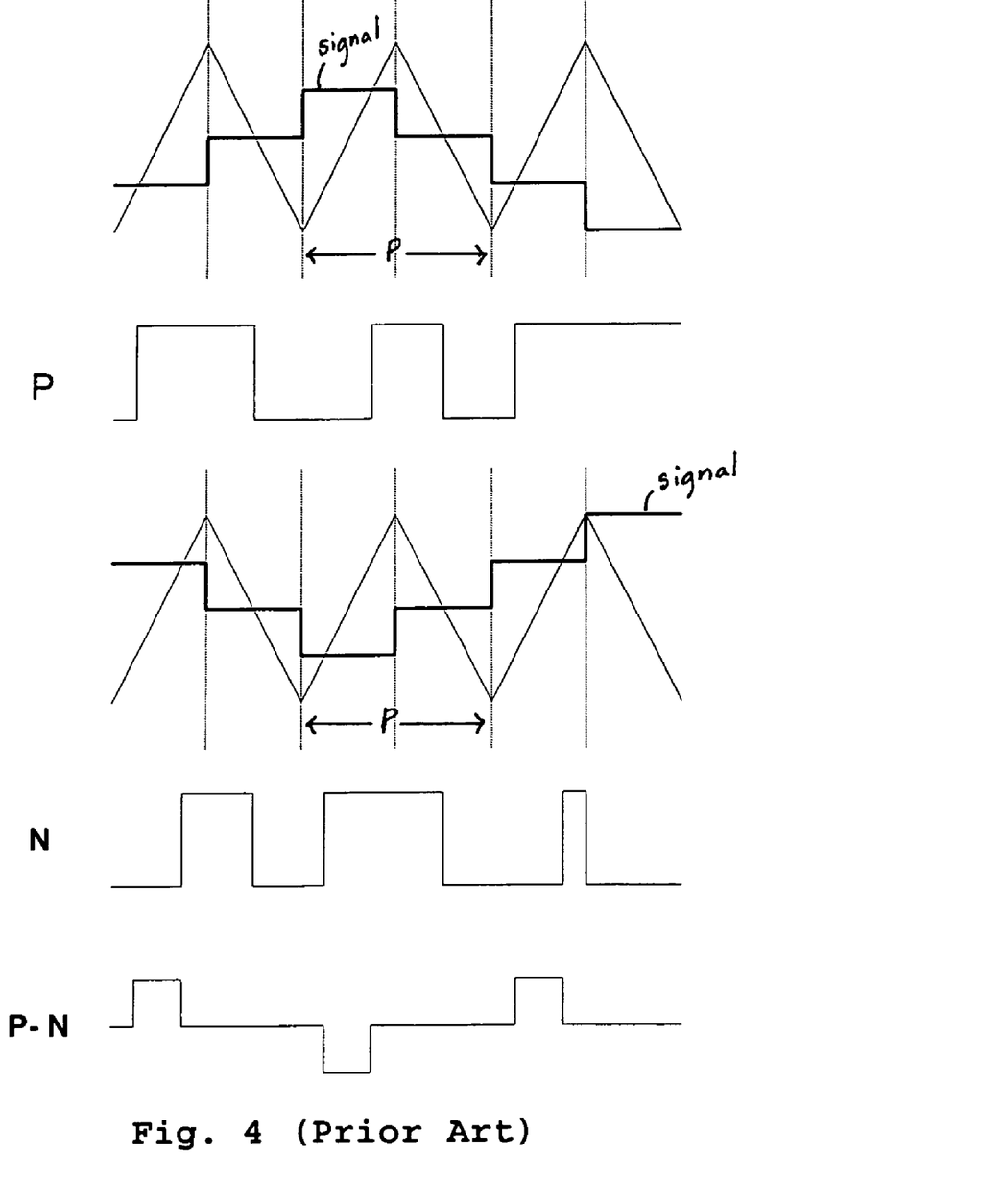
FIG. 4 illustrates the improvement of 2-samples-per-period P.

The input signal is then sampled at the peaks and troughs of the triangular wave to produce a sampled signal S. S is then compared to T to generate P and −S is compared to T to generate N (FIG. 4). As seen in FIG. 4, the position of rising edge and the position of falling edge of a single pulse are controlled by 2 different samples. This 2-samples-per-pulse scheme removes any odd harmonics in the resulting output and is thus superior to 1-sample-per-pulse scheme (where input signal is only sampled at either the peaks or the troughs of T).

Quantization errors arise when the input values fall between any 2 quantized steps in the triangular wave T. For example, in a single-ended scheme, if T has 10 steps and S=0.623, it will produce an output with 60% duty cycle (K=0.6). The difference E=S−K=0.623−0.6=0.023 is the quantization error and it contributes to noise and degrades the performance.

One solution is to increase the clock speed so that a triangular wave with finer step-sizes can be generated. Finer step sizes reduce the maximum quantization error and improve performance Other solutions make use of noise-shaping loops to quantize the signal before pulse width modulating it to a PWM waveform.

Another solution is to put in some hysteresis in the quantizer of a sigma delta modulator.

This invention allows resolution to be improved by using variable pulse periods.

DETAILED DESCRIPTION OF THE PREFERRED EMBODIMENTS

The present invention improves the tradeoff between resolution and clock speed in pulse width modulation circuits so that a higher resolution can be achieved with a lower clock speed. Aspects of the preferred embodiments may include:

1. Allowing both pulse width and pulse period (V & P) to vary so that S can be better approximated by the pulse value K=V/P.

2. Online computation of V and P using a mixture of sequential search and direct calculation.

3. Error distribution (error carry-forward) to resolve small signals and to further improve resolution.

4. Error squelching to prevent idle-tone, idle-noise artifacts.

5. Applying 2-sample-per-pulse to get rid of odd harmonics.

6. Non-uniform sampling and pulsing scheme to ensure fixed delay between sampling and pulsing.

7. Configurable maximum carrier frequency.

The first observation of this invention is that P does not need to be fixed.

Denote V as the pulse width and P as the pulse period. Then, the pulse value K=V/P. S is the sampled input and the error E=S−V/P.

The problem now simplifies to:
Finding P subject to (Pmin<=P<=Pmax), and
Finding V subject to (−P<=V<=P)
Such that the absolute value of E, i.e. |E|=|S−V/P|, is minimized Pmin and Pmax are chosen depending on the application, as they set the maximum and minimum carrier frequencies. Negative V values are possible because of the differential modulation scheme. If single-ended modulation is desired, the condition 0<=V<=P can be imposed (in place of −P<=V<=P). (Note that the traditional PWM scheme may be considered a particular case of this general scheme by setting Pmin=Pmax.)

Figure 5:
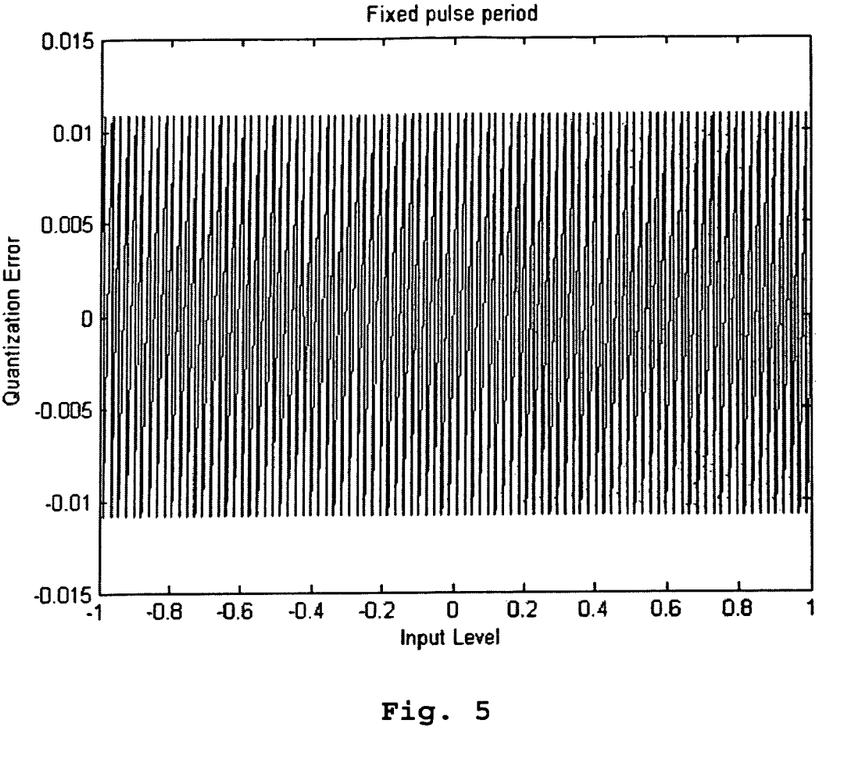
FIG. 5 shows a plot of quantization error E versus input level S when P is fixed at 46 increments in the staircase and V is allowed to vary from −46 to 46, the input ranging from −1 to 1.
Figure 6:
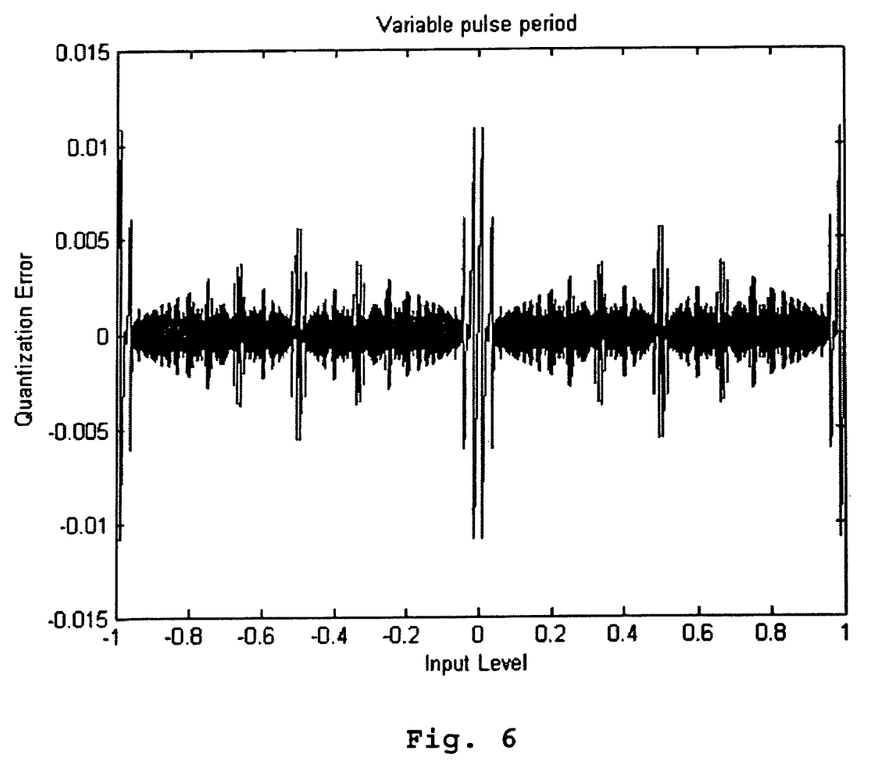
FIG. 6 is a plot similar to that of FIG. 5 but with P allowed to vary from 32 to 46 and V allowed to vary from −P to P.

FIG. 5 shows a plot of quantization error E versus input level S when P is fixed at 46 increments in the staircase and V is allowed to vary from −46 to 46, the input ranging from −1 to 1. FIG. 6 is a similar plot but with P allowed to vary from 32 to 46 and V allowed to vary from −P to P.

Comparing FIG. 5 and FIG. 6, one can see that smaller errors can be achieved if P is allowed to vary. The reason is that the introduced extra degree of freedom (P) allows S to be better approximated than with one degree of freedom (V) alone.

Figure 7:
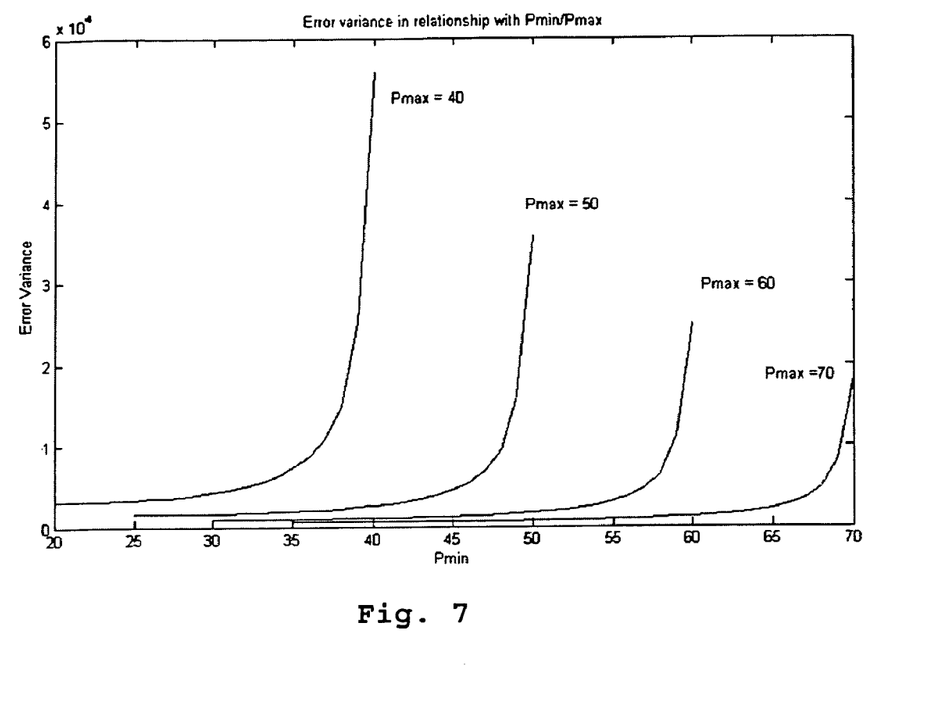
FIG. 7 is a plot of the variance of quantization (average of the squares of the error) against Pmin for Pmax=40, 50, 60 and 70 using an input range of −32768 to 32767.

FIG. 7 shows a plot of the variance of quantization (average of the squares of the error) against Pmin for Pmax=40, 50, 60 and 70. The input range is −32768 to 32767 (not −1 to 1 as in FIGS. 5 and 6). As seen, larger Pmax and smaller Pmin improves the error. When Pmin=Pmax, the results correspond to the traditional PWM scheme.

The next problem then, is to find such V and P that provides the best approximation, given all possible S values. There are no closed form solutions to this problem, and thus a 2-dimensional sequential search for V and P is necessary. The large number of V-P combinations renders it impractical for online computation. A brute-force implementation then is to do the computation offline. For each value of S, try all possible combinations of V and P in the search space and note the combination that gives rise to the minimum magnitude of the error |E|. The optimal mappings Vopt(S) and Popt(S) result, and a Lookup Table (LUT) can then be synthesized in combinational logic.

For high resolution, the LUT can be very big. That is why a novel 1-dimensional online search algorithm is preferably created.

Figure 8:
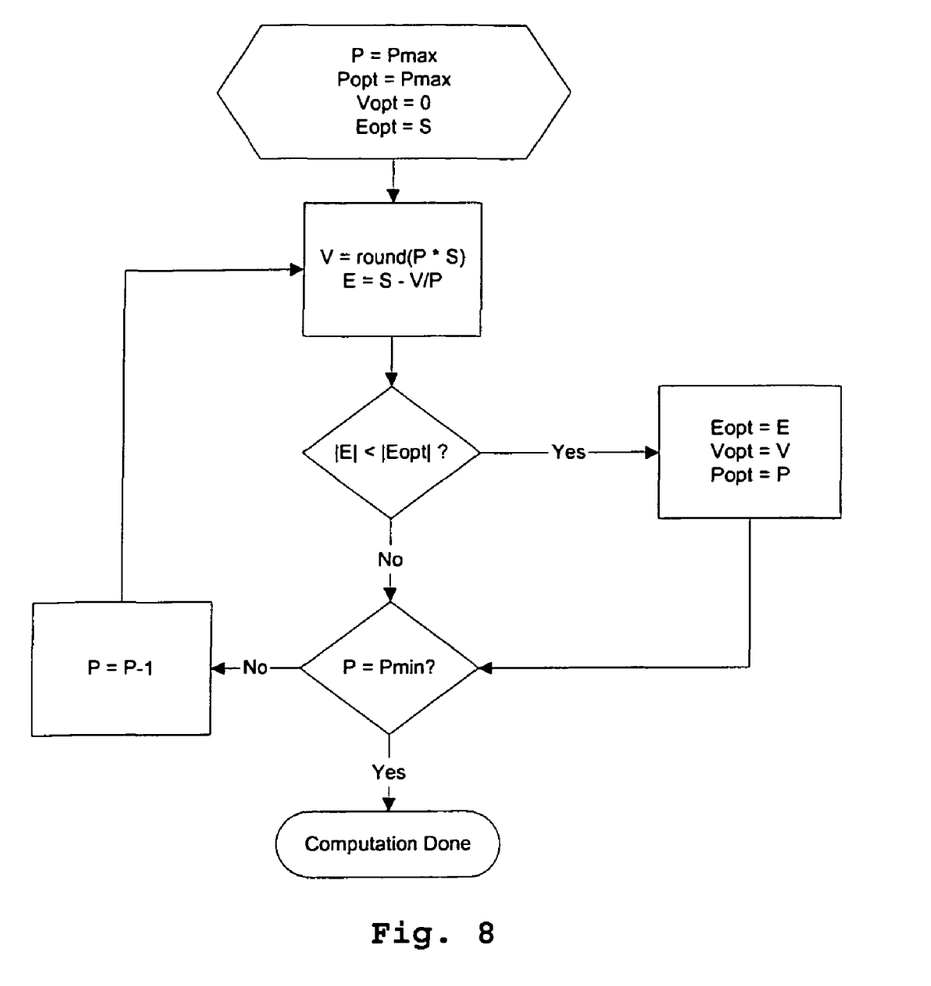
FIG. 8 illustrates one possible algorithm for use with the present invention.

FIG. 8 illustrates one possible implementation of the algorithm. The motivation of such a 1-dimensional sequential search is based on the observation that if Popt(S) is known, then Vopt(S) can be readily obtained by direct calculation:

$Vopt(S) = \text{round}(S*Popt(S))$

With such observation, the search space suddenly reduces from 2-dimension to 1-dimension, as one only needs to search P, not V. The algorithm works like this:
For each P in the search space, calculate V and E based on P
Pick the P that produces the min |E| as Popt(S)
Pick the corresponding V as Vopt(S)

In FIG. 8, the search starts at P=Pmax (it could as easily start at P=Pmin and search through increasing values of P) and sets an Popt=Pmax (Pmin if searching upward through the range of P is used), sets Eopt=S and Vopt=0, Then the pulse width V is calculated as the closest integer value of P*S, and from that, a new value of Eopt is calculated. The process is repeated for each value of P down to Pmin (or up to Pmax), with the values of Eopt, Vopt and Popt being updated each time a lower magnitude of Eopt is found. Then pulsing for a time V is initiated.

Alternatively, note that if an arbitrarily large magnitude of Eopt is initially chosen, the initial values of and Popt do not matter, as Eopt, Popt and Vopt will automatically be updated at least once after the first value of P is evaluated because of the arbitrarily large initial value of the magnitude of Eopt, and probably be updated a number of times as the search proceeds. In either event, another sample is obtained a fixed time period after a pulse begins (or equivalent time if the pulse width is zero) and the process is successively repeated.

The computation time (or complexity) is proportional to the size of the search space of P, i.e. Pmax−Pmin+1. In one design, a single multiplier is time-multiplexed to perform both the multiplication P*S and the division V/P. In any odd time step, P*S is performed. In any even time step, the division V/P is emulated by multiplying V by Pinv (V*Pinv), where Pinv=1/P. Pinv is looked up from a lookup table with P being the index. Then, the computation time in this particular design is 2*(Pmax−Pmin+1), assuming each multiplication takes one unit of time.

Figure 9:
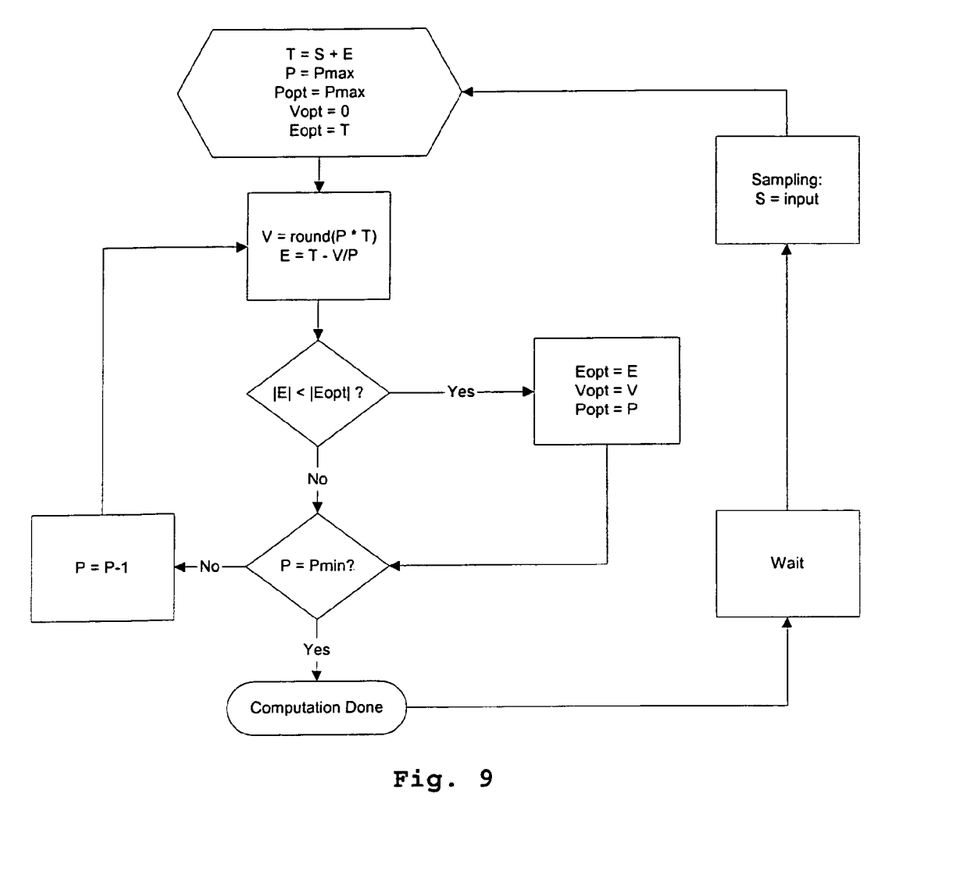
FIG. 9 illustrates the algorithm of FIG. 8 revised to provide $1^{st}$ order error distribution.

The third observation is that E results as a byproduct of the algorithm. If this error is carried forward to the following samples, the accumulated error of the PWM waveform will average to zero. The simplest error-carry-forward mechanism is to add the computed error E to the next sample, resulting in 1st order error distribution. One $2^{nd}$ order error distribution would be to add twice the computed error E to the next sample and subtract the same error E from the third sample. Other distribution schemes are possible by scaling E appropriately and distributing it among as many following samples as desired. A revised algorithm with $1^{st}$ order error distribution is illustrated in FIG. 9. This differs from the algorithm of FIG. 8 by adding the error E that corresponds to the best V and P (Vopt and Popt) to use, i.e., Eopt to the next signal sample.

According to experiments performed, error distribution schemes can help resolve small signals which, without error distribution, have high probability of incurring large errors near zero input level (FIG. 6).

An artifact of error distribution is that it may generate idle noises and idle tones, even when the input is identically zero.

Figure 10:
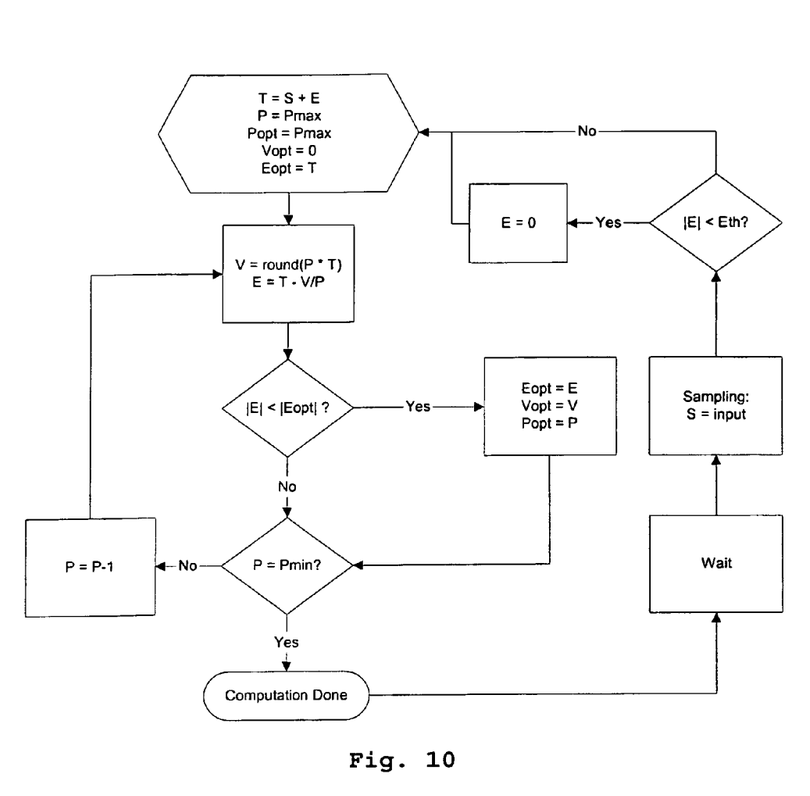
FIG. 10 illustrates the algorithm of FIG. 9 further revised to provide error squelching.

To suppress idle noises and idle tones, an error squelching block can be added. If the error magnitude |E| is smaller than some threshold Eth, then the error will be discarded and will not be carried forward. Eth is chosen based on specific application. FIG. 10 shows a revised algorithm with error squelching. This differs from FIG. 9 in that if the error E (Eopt) is less than Eth, it is ignored.

Figure 11:
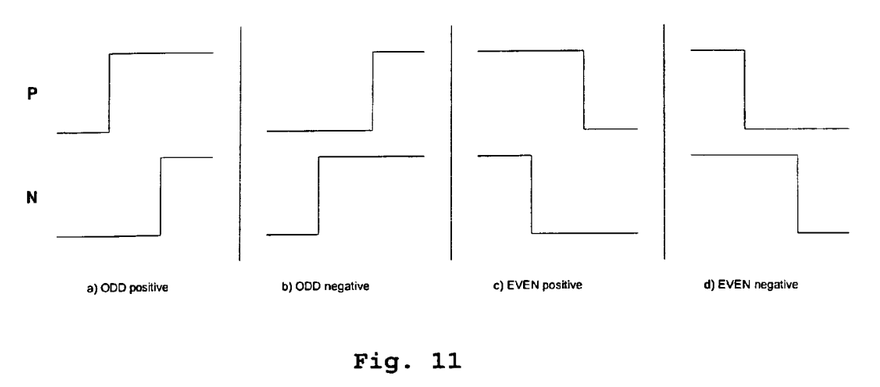
FIG. 11 illustrates the four possible P and N combinations using a 2-sample-per-pulse scheme.

Another improvement is to apply the 2-sample-per-pulse scheme, that is, 2-samples-per-period P (FIG. 4). Rising edges are generated on odd samples and falling edges are generated on even samples. For positive half-pulses (V>0), P is high for a longer duration than N. For negative half-pulses (V<0), N is high for a longer duration than P. The four possible combinations are illustrated in FIG. 11. (Pulse value can also be zero when P=N.)

Figure 12:
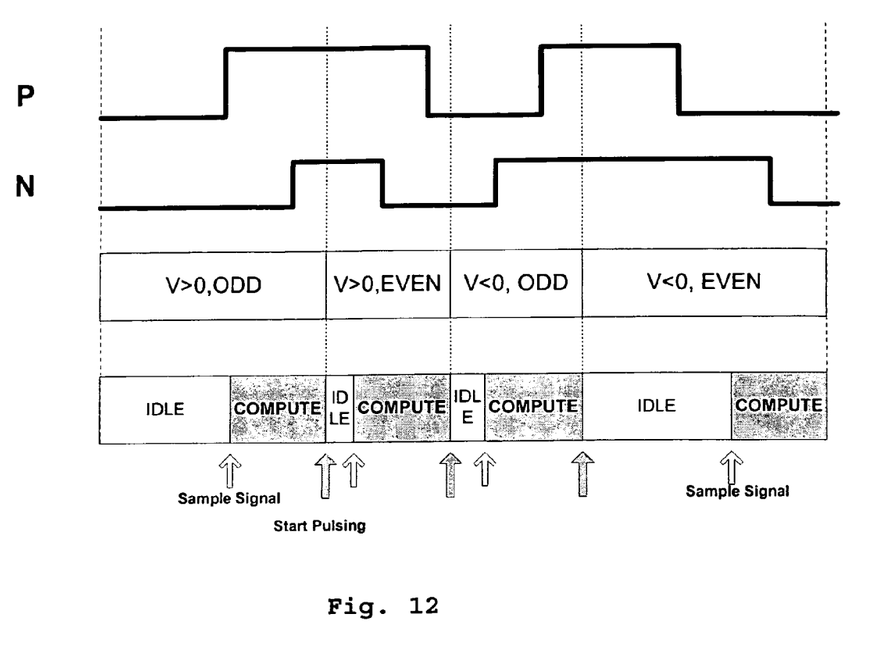
FIG. 12 shows the relation between the sampling times of each half-pulse, the computation times and the variable idle times before the next sample.

Since P is allowed to vary, a non-uniform sampling of the input results. To ensure a fixed delay between the sampling time and the beginning of a half-pulse, the sampling time must be chosen carefully so as to allow enough time for the computation. FIG. 12 shows the relation between the sampling times of each half-pulse. Since the computation time is constant, the sampling may be done just before the computation time, the computation time being followed by the start of pulsing, followed by a variable idle time before the next sample. That way, the delay is constant and limited to the computation time, independent of the period P. Thus sampling preferably occurs a predetermined time before the beginning of the period associated with the sample (i.e., during the prior period P) to allow computation time. Note also that since pulsing begins after the computation time, pulsing in effect is shifted to the beginning of the period rather than occurring in the middle of the period, though alternatively one could pulse in the middle of the period if desired.

It follows that the computation time must be shorter than the duration of the shortest possible half-pulse or pulse period, i.e., <Pmin. This sets a practical lower bound for Pmin (theoretically, we want Pmin=0 and Pmax=infinity to allow V/P to best approximate S). For example in one design, the computation time is 2*(Pmax−Pmin+1), then Pmin>=2*(Pmax+2)/3. Pmax on the other hand has to be small enough to prevent aliasing in the sampling. Note that depending on the choice of Pmin and the pulse width V, signal sampling for the next period P may easily occur before the end of the pulse in the present period. Also, a large signal S does not necessarily lead to a large pulse width. In particular, while a large signal will cause a pulse width V having a high duty cycle for the period P, the period P for the minimum magnitude of the error E may in fact be Pmin or close to Pmin, yielding a smaller pulse width than if the period P for the minimum magnitude of the error E was in fact Pmax or closer to Pmax.

In one embodiment, Pmin and Pmax are register-configurable (programmable) so that users can optimize the device for their specific application. The operations themselves may be carried out in fixed logic or in a processor under program control.

Figure 13:
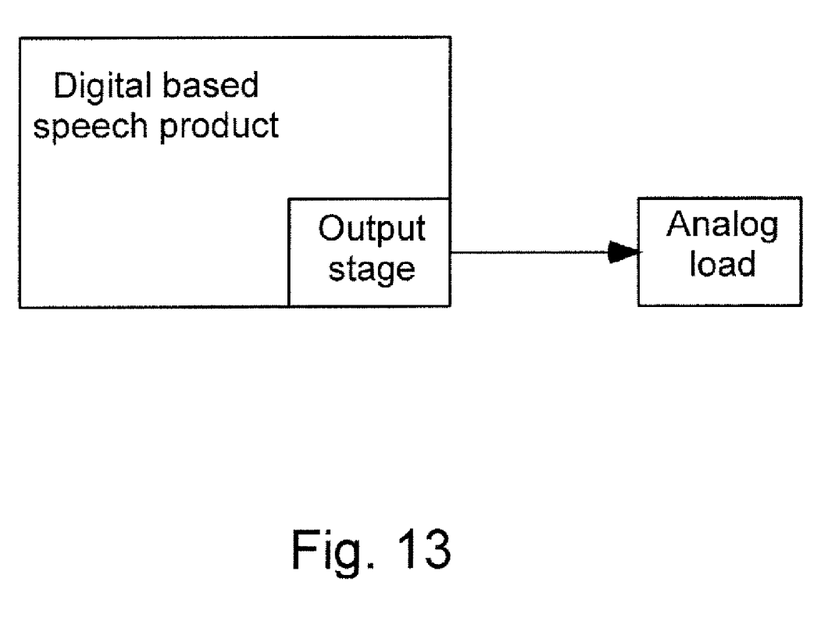
FIG. 13 illustrates the use of the present invention in digital-based speech products.

Preferred embodiments directly convert digital audio data to a PWM waveform ready to drive any analog load. It can be applied to the output stages of any digital-based speech products offering lower cost and better resolution (better performance) as shown in FIG. 13.

While certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A method of digital pulse width modulation of a signal comprising:
   using fixed logic or a processor under program control, to perform the following steps:
   a) for a signal sample S and each value of P in a range Pmin to Pmax of pulse periods P, determining a pulse width V=round(P*S), where round(P*S) is the closest integer value of P*S, and magnitude of the error |E|=|S−V/P|;
   b) for the value of V (Vopt) and P (Popt) associated with the lowest value of the magnitude of the error |E|, providing an output pulse of a pulse width Vopt during the pulse period Popt;
   c) using the output pulse to drive an analog load; and
   d) successively repeating a) through c) for each successive signal sample S.

2. The method of claim 1 wherein each signal sample is taken a fixed time before the beginning of a new period P associated with that signal sample S.

3. The method of claim 2 wherein the output pulse begins at the beginning of a new period.

4. The method of claim 2 wherein the fixed time is adequate to accomplish a), even when the period P associated with the prior sample S is Pmin.

5. The method of claim 1 further comprising for each signal sample S, adding an amount responsive to the error E=S−V/P associated with at least one prior sample to the signal sample S to obtain a new value of S before the determination of a).

6. The method of claim 1 further comprising for each signal sample S, adding an amount responsive to the error E=S−V/P associated with at least one prior sample to the signal sample S to obtain a new value of S before the determination of a) if the magnitude of that error E exceeds a respective predetermined threshold value.

7. The method of claim 1 further comprising for each signal sample S, adding the error E=S−V/P associated with the prior sample to the signal sample S to obtain a new value of S before the determination of a).

8. The method of claim 1 further comprising for each signal sample S, adding an amount responsive to the error E=S−V/P associated with the prior sample to the signal sample S to obtain a new value of S before the determination of a) if the magnitude of that error E exceeds a predetermined threshold value.

9. The method of claim 1 wherein the values of Pmin and Pmax are programmable.

10. A method of digital pulse width modulation of a signal comprising:
    using fixed logic or a processor under program control, to perform the following steps:
    a) obtaining a signal sample S;
    b) for the signal sample S and each value of P in a range Pmin to Pmax of pulse periods P, determining a pulse width V=round(P*S), where round(P*S) is the closest integer value of P*S, and magnitude of the error |E|=|S−V/P|;
    c) for the value of V (Vopt) and P (Popt) associated with the lowest value of the magnitude of the error |E|, providing an output pulse of a pulse width Vopt during the pulse period Popt, wherein Popt begins a predetermined time period after a)
    d) using the output pulse to drive an analog load; and
    e) successively repeating a) through d), wherein a) occurs the predetermined time period before the end of Popt associated with the prior sample S.

11. The method of claim 10 wherein the output pulse begins at the beginning of a new period.

12. The method of claim 10 wherein the predetermined time period is adequate to accomplish a), even when the period P associated with the prior sample S is Pmin.

13. The method of claim 10 further comprising for each signal sample S, adding an amount responsive to the error E=S−V/P associated with at least one prior sample to the signal sample S to obtain a new value of S before the determination of a).

14. The method of claim 10 further comprising for each signal sample S, adding an amount responsive to the error E=S−V/P associated with at least one prior sample to the signal sample S to obtain a new value of S before the determination of a) if the magnitude of that error E exceeds a respective predetermined threshold value.

15. The method of claim 10 further comprising for each signal sample S, adding the error E=S−V/P associated with the prior sample to the signal sample S to obtain a new value of S before the determination of a).

16. The method of claim 10 further comprising for each signal sample S, adding an amount responsive to the error E=S−V/P associated with the prior sample to the signal sample S to obtain a new value of S before the determination of a) if the magnitude of that error E exceeds a predetermined threshold value.

17. The method of claim 10 wherein the values of Pmin and Pmax are programmable.

* * * * *